(12) United States Patent
Hunt, Jr. et al.

(10) Patent No.: US 6,448,831 B1
(45) Date of Patent: Sep. 10, 2002

(54) TRUE SINGLE-PHASE FLIP-FLOP

(75) Inventors: Barry Travis Hunt, Jr.; Scott Robert Humphreys, both of Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/879,671

(22) Filed: Jun. 12, 2001

(51) Int. Cl.$^7$ ............................................... H03K 3/356

(52) U.S. Cl. .......................... 327/211; 327/200; 327/218

(58) Field of Search ................................. 327/200, 203, 327/208, 210, 211, 212, 215, 218, 219, 34, 310, 313, 384; 326/95–98

(56) References Cited

U.S. PATENT DOCUMENTS

| | | | |
|---|---|---|---|
| 3,538,450 A | 11/1968 | Andrea et al. ................. | 331/10 |
| 4,609,881 A | 9/1986 | Wells .......................... | 331/1 A |
| 4,875,046 A | 10/1989 | Lewyn ......................... | 341/148 |
| 4,920,282 A | 4/1990 | Muraoka ..................... | 307/442 |
| 4,953,187 A | 8/1990 | Herold ......................... | 337/48 |
| 4,965,474 A | * 10/1990 | Childers et al. ............. | 327/310 |
| 4,965,531 A | 10/1990 | Riley .......................... | 331/1 A |

(List continued on next page.)

OTHER PUBLICATIONS

Chang, Byngsoo, et al. "A 1.2 GHz CMOS Dual–Modulus Prescaler Using New Dynamic D–Type Flip–Flops," IEEE Journal of Solid–State Circuits, vol. 31, No. 5, May, 1996, pp. 749–752.

Huang, Qiuting, and Rogenmoser, Robert, "Speed Optimization of Edge–Triggered CMOS Circuits for Gigahertz Single–Phase Clocks," IEEE Journal of Solid–State Circuits, vol. 31, No. 3, Mar., 1996, pp. 456–465.

Motorola Semiconductor Technical Data, "The Technique of Direct Programming by Using a Two–Modulus Prescaler," Originally printed May 1981, reformatted Oct. 1995, Document No. AN827/D.

Owen, David, "Fractional–N Synthesizers," IFR Application Note, IFR Americas, 2001, www.ifrsys.com.

Pohjonen, H. and Ronkainen, H., "A 1 GHz CMOS Prescaler for RF Synthesizers," 1988 Proceedings of ISCAS, pp. 377–380, CH2458–8/88/0000–0377.

(List continued on next page.)

Primary Examiner—Terry D. Cunningham
Assistant Examiner—Long Nguyen
(74) Attorney, Agent, or Firm—Withrow & Terranova, P.L.L.C

(57) ABSTRACT

Undersired glitches in output signals from TSPC-1 flip-flop circuits having an output stage comprising an node and a second node are removed by precharging the second node (prior to a clock transition) to a value desired at the output node during a period following the clock transition, and connecting the output node to the second node upon such clock transition. Corrective circuitry illustratively comprising two NMOS transistors added to the output stage and receiving an input reflecting the desired future output is active during a portion of the operating cycle when the output stage exhibits a high impedance tristate condition.

13 Claims, 3 Drawing Sheets

U.S. PATENT DOCUMENTS

| | | | |
|---|---|---|---|
| 4,991,187 A | 2/1991 | Herold | 337/48 |
| 5,022,054 A | 6/1991 | Wang | 375/64 |
| 5,038,117 A | 8/1991 | Miller | 331/16 |
| 5,055,800 A | 10/1991 | Black | 331/1 A |
| 5,055,802 A | 10/1991 | Hietala | 331/16 |
| 5,058,427 A | 10/1991 | Brandt | 73/384 |
| 5,068,875 A | 11/1991 | Quintin | 375/78 |
| 5,070,310 A | 12/1991 | Hietala | 331/1 A |
| 5,079,522 A | 1/1992 | Owen | 331/16 |
| 5,093,632 A | 3/1992 | Hietala | 331/1 A |
| 5,111,162 A | 5/1992 | Hietala | 332/127 |
| 5,117,206 A | 5/1992 | Imamura | 331/158 |
| 5,166,642 A | 11/1992 | Hietala | 331/1 A |
| 5,235,335 A | 8/1993 | Hester et al. | 341/172 |
| 5,281,865 A | 1/1994 | Yamashita | 307/279 |
| 5,301,367 A | 4/1994 | Heinonen | 455/76 |
| 5,337,024 A | 8/1994 | Collins | 332/127 |
| 5,341,033 A * | 8/1994 | Koker | 327/310 |
| 5,365,548 A | 11/1994 | Baker | 375/62 |
| 5,493,700 A | 2/1996 | Hietala | 455/75 |
| 5,493,715 A | 2/1996 | Humphreys et al. | 455/264 |
| 5,495,206 A | 2/1996 | Hietala | 331/1 A |
| 5,552,738 A | 9/1996 | Ko | 327/203 |
| 5,563,532 A * | 10/1996 | Wu et al. | 327/34 |
| 5,592,114 A * | 1/1997 | Wu et al. | 327/208 |
| 5,684,795 A | 11/1997 | Daniel | 370/347 |
| 5,745,848 A | 4/1998 | Robin | 455/296 |
| 5,777,521 A | 7/1998 | Gillig | 331/16 |
| 5,778,028 A | 7/1998 | Turner | 375/229 |
| 5,822,366 A | 10/1998 | Rapeli | 375/219 |
| 5,825,257 A | 10/1998 | Klymyshyn | 332/100 |
| 5,857,004 A | 1/1999 | Abe | 375/344 |
| 5,859,890 A | 1/1999 | Shurboff | 377/48 |
| 5,883,930 A | 3/1999 | Fukushi | 375/376 |
| 5,892,385 A | 4/1999 | Hashiguchi | 327/333 |
| 5,898,330 A | 4/1999 | Klass | 327/210 |
| 5,900,758 A | 5/1999 | Kanno | 327/201 |
| 5,917,355 A | 6/1999 | Klass | 327/208 |
| 5,920,556 A | 7/1999 | Jorgensen | 370/350 |
| 5,933,038 A * | 8/1999 | Klass | 327/208 |
| 5,943,613 A | 8/1999 | Wendelrup | 455/343 |
| 5,973,633 A | 10/1999 | Hester | 341/172 |
| 6,008,703 A | 12/1999 | Perrott | 332/100 |
| 6,008,704 A | 12/1999 | Opsahl | 332/127 |
| 6,043,696 A | 3/2000 | Klass | 327/211 |
| 6,060,927 A | 5/2000 | Lee | 327/218 |
| 6,064,272 A | 5/2000 | Rhee | 331/16 |
| 6,097,259 A | 8/2000 | Saito | 332/103 |
| 6,100,730 A | 8/2000 | Davis | 327/117 |
| 6,121,807 A | 9/2000 | Klass | 327/218 |
| 6,154,077 A | 11/2000 | Waible | 327/185 |
| 6,163,710 A | 12/2000 | Blaser | 455/552 |
| 6,275,083 B1 * | 8/2001 | Martinez et al. | 327/218 |
| 6,323,709 B1 * | 11/2001 | Kulkarni et al. | 327/218 |

OTHER PUBLICATIONS

Rogenmoser, R. et al., "1.57 GHz Asynchronous and 1.4 GHz Dual–Modulus 1.2 micrometer CMOS Prescalers," IEEE Customer Integrated Circuits Conference, 1994, pp. 387–390, 0–7803–1886–2/94.

Yang, Ching–Yuan, and Liu, Shen–Iuan, "Fast–Switching Frequency Synthesizer with a Discriminator–Aided Phase Detector," IEEE Journal of Solid–State Circuits, vol. 35, No. 10, Oct. 2000, pp. 1445–1452, 0018–9200/00.

Yuan, Jiren, and Svensson, Christer, "High–Speed CMOS Circuit Technique," IEEE Journal of Solid–State Circuits, vol. 24, No. 1, Feb. 1989, pp. 62–70, 0018–9200/89.

Yuan, Jiren and Svensson, Christer, "New Single–Clock CMOS Latches and Flipflops with Improved Speed and Power Savings," IEEE Journal of Solid–State Circuits, vol. 32, No. 1, Jan. 1997, pp. 62–69, 0018–9200/97.

Razavi, Behzad, "RF Microelectronics," Prentice Hall PTR, Upper Saddle River, NJ, 1998.

Dunning et al., "An All–Digital Phase–Locked Loop with 50–Cycle Lock Time Suitable for High–Performance Microprocessors," IEEE Journal of Solid–State Circuits, vol. 30, No. 4, Apr. 1999, pp. 412–422.

Kral et al., "RF–CMOS Oscillators with Switched Tuning," Proceedings of the IEEE 1998 Custom Integrated Circuits Conference, May 1998, pp. 555–558.

Miller, Brian and Conley, Robert J., "A Multiple Modulator Fractional Divider," IEEE Transactions on Instrumentation and Measurement, vol. 40, No. 3, Jun. 1991, pp. 578–583.

Wilson et al., "A CMOS Self–Calibrating Frequency Synthesizer," IEEE Journal of Solid–State Circuits, vol. 35, No. 10, Oct. 2000, pp. 1437–1444.

* cited by examiner

TRUE SINGLE-PHASE FLIP-FLOP

RELATED APPLICATIONS

The present application is related to concurrently filed non-provisional applications:

(i) by A. W. Hietala entitled Fractional-N Modulation with Analog IQ Interface;

(ii) by S. R. Humphreys and B. T. Hunt entitled Dual-Modulus Prescaler;

(iii) by A. W. Hietala and S. R. Humphreys entitled Fractional-N Synthesizer with Improved Noise Performance; and (iv) by A. W. Hietala and S. R. Humphreys entitled Accumulator with Programmable Full-Scale Range, which non-provisional applications are assigned to the assignee of the present invention, and are hereby incorporated in the present application as if set forth in their entirety herein.

FIELD OF THE INVENTION

The present invention relates to digital logic circuits. More particularly, the present invention relates to dynamic flip-flop circuits. Still more particularly, the present invention relates to true single-phase dynamic flip-flop circuits.

BACKGROUND OF THE INVENTION

The class of logic circuits known as dynamic logic circuits has gained considerable favor in recent years by offering advantages in many applications in speed and power dissipation when compared with many prior circuit techniques. See, for example, J. M. Rabaey, *Digital Integrated Circuits*, Prentice-Hall, 1996, especially pp. 222–234 and 347–363. Early dynamic flip-flops employed a two-phase clock controlling operations in precharge and evaluation modes of operation.

More recently, a variety of so-called true single-phase clock (TSPC) dynamic circuits have provided increased flexibility in designs while maintaining speed and power advantages. See, J. Yuan and C. Svensson, "New Single-Clock CMOS Latches and Flipflops with Improved Speed and Power Savings," *IEEE J Solid-State Circuits*, vol. 32, pp. 62–69, January, 1997, and Rabaey, supra, at pp. 359–363.

FIG. 1 shows a prior art TSPC-1 full-latch flip-flop (sometimes, TSPC1FL, but hereinafter TSPC-1 flip-flop) of a type described generally in the above-cited paper by Yuan and Svensson. This circuit operates as a negative edge-triggered flip-flop that is advantageously viewed as comprising three CMOS stages: an input stage (from input D to node A), a middle stage (from node A to node B), and an output stage (from node B to output /Q). In FIG. 1, the MPi, i=1–4 are PMOS devices and the MNj,j=1–6 are NMOS devices.

Table 1 illustrates operation of the respective stages of the circuit of FIG. 1 during high and low clock phases.

TABLE 1

| Clock | Input Stage | Middle Stage | Output Stage |
|---|---|---|---|
| High | Evaluate | Invert | Tristate |
| Low | Precharge | Tristate | Invert |

In Table 1, tristate refers to a high impedance state that effectively disconnects devices MP4 and MN5 from output lead /Q, (as well as MP2 and MN3 from node B) in accordance with standard industry usage.

FIG. 2 shows waveforms appearing over time at identified locations in the circuit of FIG. 1 in relation to an input clock signal (CLK). The output at /Q is updated at each high-to-low transition of CLK, at which time the output stage changes from a tristate holding state to operation as a CMOS inverter in accordance with Table 1. The circuit of FIG. 1 avoids one glitch that occurs due to charge sharing when an input at node D remains low for more than one cycle of CLK. See further, Q. Huang and R. Rogenmoser, "Speed Optimization of Edge-Triggered CMOS Circuits for Gigahertz Single-Phase Clocks," *IEEE J Solid-State Circuits*, vol. 31, pp. 456–465, March 1996.

However, the TSPC-1 flip-flop of FIG. 1 exhibits another glitch in high frequency operation across process and environmental variations that arises from a different mechanism than that identified by Huang et al., cited above. To illustrate this latter glitch it proves useful to consider the following example. Assume the clock signal is high and the D input signal is at a logic high. Also assume that the output (/Q) is currently holding a low logic level during its tristate mode. Under these conditions the input stage has discharged so that node A is a logic low and the middle stage is performing the function of an inverter so that node B is a logic high. The output stage is in the tristate mode with the output holding a logic low signal from the previous low phase of the input clock.

Since the D input is at a logic high, when the clock transitions from high to low, the /Q output value should remain at a logic low as the output stage transitions from tristate operation to inverter operation. However, the /Q output signal will exhibit a glitch where the output logic low value spikes high on the high-to-low transition of CLK before returning to the correct logic low value after the clock settles low. This is shown in the /Q waveform of FIG. 2 at reference numeral 3. Across temperature and process variations, the magnitude of this glitch is large enough to improperly trigger following logic stages.

It has previously been found that proper operation of TSPC-1 flip-flops can be improved by judiciously choosing sizes of critical transistors to reduce glitches. Unfortunately, most transistors in TSPC-1 flip-flops have conflicting sizing requirements; roles played by individual transistors change, e.g., from drivers to loads, and vice versa, with clock phase changes. Thus, for a given clock phase, a particular transistor may function as a driver (indicating that it should have a relatively large size). In contrast, the same transistor may switch roles and function as a load (indicating that the it should have a relatively small size) on the next phase of the clock. Therefore, sizing of transistors in a TSPC-1 flip-flop to achieve maximum operating frequency is a balance between two conflicting sizing requirements, as noted in the above-cited paper by Huang and Rogenmoser.

Particular sizing of transistors in a TSPC-1 flip-flop for high frequency operation may introduce glitches like the one demonstrated above, but resizing to reduce glitches can reduce the maximum operating frequency of these flip-flops. Furthermore, sizing compromises generally result in increases in the overall size of the flip-flop, thereby reducing its maximum operating frequency. In addition, if it is possible to remove the dual (driver/load) nature of a critical transistor, the size of the transistor can be optimized for maximum operating frequency, but often at the expense of increased circuit complexity and/or power dissipation.

Accordingly, a need exists to improve the circuit of FIG. 1 to remove glitches of the type shown in FIG. 2. Moreover, such needed improvements desirably avoid any substantial increase in power consumption, undue circuit complexity, or reduced maximum operating frequency while removing such glitches. A particular need exists for such improved operation for application to circuits such as the dual-modulus synchronous divider sections of a dual-modulus prescaler of the types described in incorporated patent application (ii) cited above.

SUMMARY OF THE INVENTION

Limitations of the prior are overcome and a technical advance is made in accordance with the present invention, typical embodiments of which are described below.

In particular, illustrative embodiments of improved TSPC-1 flip-flop circuits are described that are based, in part, on the observation that the logic level stored on node B of the circuit of FIG. 1 during the high phase of the clock is the inverse of the future logic value to be transferred to the /Q output on the subsequent high to low transition of the clock. It therefore proves advantageous to invert this logic level and transfer it directly to node C, preserving the current value of the /Q output. This approach exploits the off state of MP4 occurring during the high clock phase, while pre-setting the logic level at node C to the correct future /Q output value. This method also allows any charge that might be previously stored on node C, to discharge to VSS during the high clock phase. In this manner, the momentary connection of the /Q output to node C does not cause a glitch in the output-since the final value of the output has already been pre-set on node C.

In accordance with one illustrative embodiment of the present invention the TSPC-1FL flip-flop of FIG. 1 is modified by the addition of corrective circuitry applied to node C. Corrective circuitry in the illustrative embodiment comprises two NMOS transistors added to the TSPC-1 flip-flop of FIG. 1 that are only active during the high clock phase (while the output stage exhibits tristate operation), thereby avoiding interference with operation of the output stage in its inverter mode.

Other illustrative embodiments also include a NAND input logic arrangement and additional output circuitry to provide complementary output signals.

These and other embodiments of the present invention may be realized in circuit designs that avoid transistor size increases in selected transistors as suggested in prior work. Embodiments based on present inventive teachings therefore remove the undesired glitches without reducing maximum operating frequency and without substantial increase of power consumption.

BRIEF DESCRIPTION OF THE DRAWING FIGURES

The above-summarized invention will be more fully understood upon consideration of the following detailed description and the attached drawing wherein.

DETAILED DESCRIPTION

The following detailed description and accompanying drawing figures depict illustrative embodiments of the present invention. Those skilled in the art will discern alternative system and method embodiments within the spirit of the present invention, and within the scope of the attached claims, from consideration of the present inventive teachings.

Figure 1:
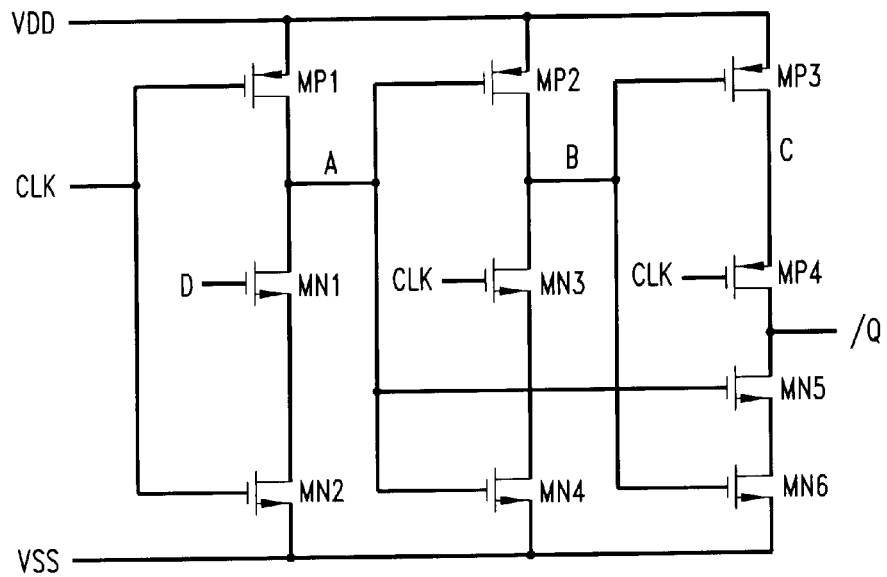
FIG. 1 shows a prior art TSPC-1FL flip-flop.
Figure 2:
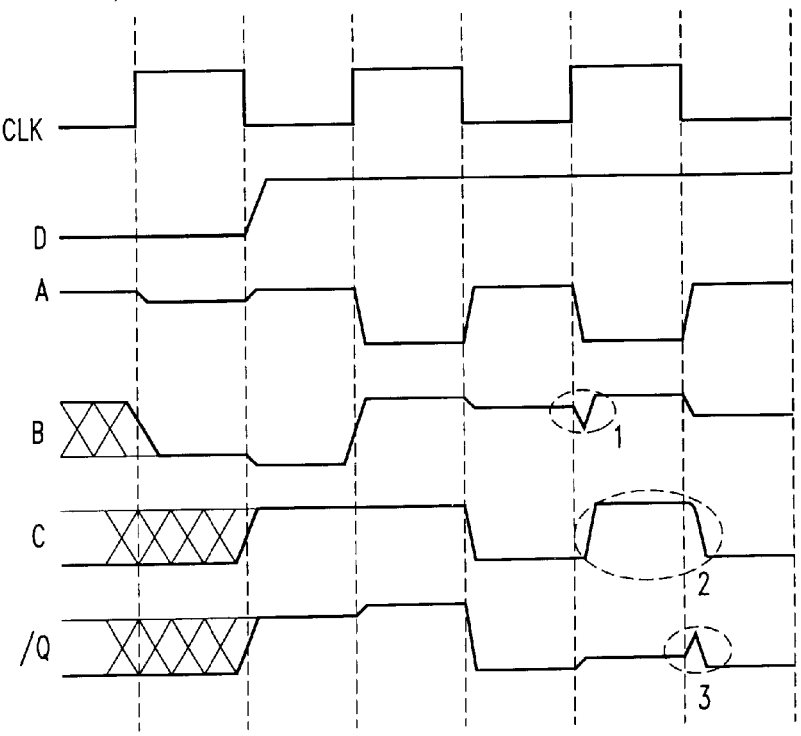
FIG. 2 shows waveforms associated with operation of the flip-flop of FIG. 1.

To better understand the mechanism giving rise to the glitch on the /Q waveform shown in FIG. 2, it proves useful to examine how the output stage of FIG. 1 produces a logic low output during the low clock phase under the cited conditions. In such case, the output switches to operation as an inverter as the clock falls from high to low. Since node B is charged to a logic high during the high clock phase, the output stage should produce the logic low output value by connecting the /Q output node to the VSS supply through NMOS transistors MN5 and MN6. Since the clock is low, PMOS transistor MP4 will also be conducting. The node B logic high will prevent the PMOS transistor MP3 from conducting, but will cause NMOS transistor MN6 to be conducting. Therefore, only the MP4 and MN5 transistors must switch states of operation (both from the off state to the conducting state) on the clock transition from low to high.

It will be noted, however, that there is an inherent delay between the conduction of transistor MP4 and transistor MN5 upon a high-to-low transition of CLK: transistor MP4 will always receive a change of gate potential before transistor MN5. This is due to the fact that the gate of MP4 is connected directly to the clock signal, whereas the gate of MN5 is connected to node A. Node A, in turn, always exhibits a logic high during the low clock phase due to precharging of the input stage during low clock phases. But Node A can rise to a logic high level only after MP1 switches from the off state to the conducting state following the high-to-low transition of CLK. Accordingly, there is a non-zero delay between a change of potential at the gate of MP1 and the change in potential of node A, and equivalently, the gate of MN5. Therefore, MP1 and MP4 will experience a change in gate potential simultaneously, with a change in the gate potential occurring at the gate of MN5 only after a non-zero delay associated with the time to charge the load and parasitic capacitance on node A through the resistance of the conductive channel of MP1. It follows, then, that MP4 will begin to conduct before MN5 for reasonably sized transistors.

The result of the delay between MP4 conducting and MN5 conducting is that the /Q output will have a conducting path to node C before the conduction path (through MN5) to VSS is established. Since the /Q output is holding a charge level set by a previous low clock phase, the update to the /Q output will initially be determined by the charge stored on node C-until the conduction path between /Q and VSS can be established. If node C is at a high charge level, the /Q output will momentarily spike high as the charge is transferred from node C to /Q during the period before MN5 begins to conduct. For the example conditions given above, the conventional TSPC-1 flip-flop of FIG. 1 will, in fact, have a high charge level stored on node C, thereby creating the output glitch cited above.

Continuing with the example above, it will be noted that node C acquires a high charge level following the immediately preceding clock transition (from low to high) prior to the high-to-low clock transition associated with the output glitch 3 on the IQ waveform in FIG. 2. There are two mechanisms contributing to the high charge level at node C in the example. First, as the clock transitions from low to high, the change in gate potential on the MP4 transistor causes some of the charge that is being deposited on that gate by the clock signal to "feed through" the parasitic gate-to-source capacitance and charge node C slightly. This mechanism only produces a slight increase in the potential at node C and is not itself significant enough to cause the glitch observed at 3 on the /Q waveform.

The predominant mechanism contributing to the increase in node C potential involves the operation of the middle stage of the flip-flop during the low to high clock transition. More specifically, with the clock in the low phase, node A is precharged to a logic high. This causes NMOS transistor MN4 to conduct. The MN3 transistor is off, as is the MP2 transistor. This enforces the correct middle stage tristate condition. As the clock transitions from low to high with the D input at a logic high, both MN1 and MN2 will begin to conduct, thus pulling node A to a logic low. As node A lowers in potential, the MN4 transistor will begin to switch from the conduction state to the off state. Also, as the clock signal becomes high, MN3 will begin to conduct. This places the middle branch in the correct inverter mode of operation and the low potential at node A will cause MP2 to conduct, placing the correct logic high on node B.

If node B was previously tristating with a logic high during the low phase of the clock, then a clock change from low to high should cause the potential on node B to remain at a logic high as the middle branch moves from the tristate to the inverter mode of operation. However, if MN3 begins to conduct before node A is pulled sufficiently low (via the conduction of MN1 and MN2) to turn MN4 off, there will be a short time when both MN3 and MN4 are conducting before MP2 can start to conduct. This will cause node B to momentarily discharge to VSS, thus causing a momentary drop in potential shown at reference numeral 1 on the B waveform in FIG. 2. This lower voltage level at node B will, in turn, cause MP3 to conduct briefly. If MP4 has already transitioned to the off state, node C will briefly be connected to VDD and the charge transfer will increase the potential at node C towards VDD. As node A eventually is discharged to VSS, MN4 will switch to the off state and MP2 will begin to conduct, once again charging node B to a logic high and turning off MP3. At this point, the charge stored on node C is prevented from discharging since both MP3 and MP4 are in the off state. Therefore, node C contains a high charge throughout the high clock phase, as shown at reference numeral 2 on the C waveform in FIG. 2. Subsequently, when the clock transitions from high to low in the example above and the /Q output is momentarily connected to node C before being discharged to VSS, the high charge level on node C will be transferred to the /Q output, thus causing the observed glitch at reference numeral 3 in FIG. 2.

Process variations can cause the threshold voltage (Vt) for some realizations of MP3 to drop, thus allowing such MP3s to conduct for a longer period of time and increasing the total charge transferred to node C and its corresponding potential. Therefore, the output spike shown at 3 in FIG. 2 tends to increase in peak voltage level as device processing tends towards lower values of Vt associated with faster device operating speeds.

The occurrence of output glitches (3 in FIG. 2) for the case of an extended logic high on the input D (extended logic low on the output /Q) can be summarized as: (1) with the clock low, /Q is assumed low and as the clock transitions from low to high, the momentary simultaneous conduction of MN3 and MN4 cause node B to momentarily glitch low, placing a high charge on node C; and, (2) when the clock then transitions from high to low, the conduction of MP4 before MN5 causes the high charge stored on node C to be transferred to /Q, thereby causing the /Q output to spike high until MN5 begins to conduct and the output returns to the correct logic low.

Figure 3:
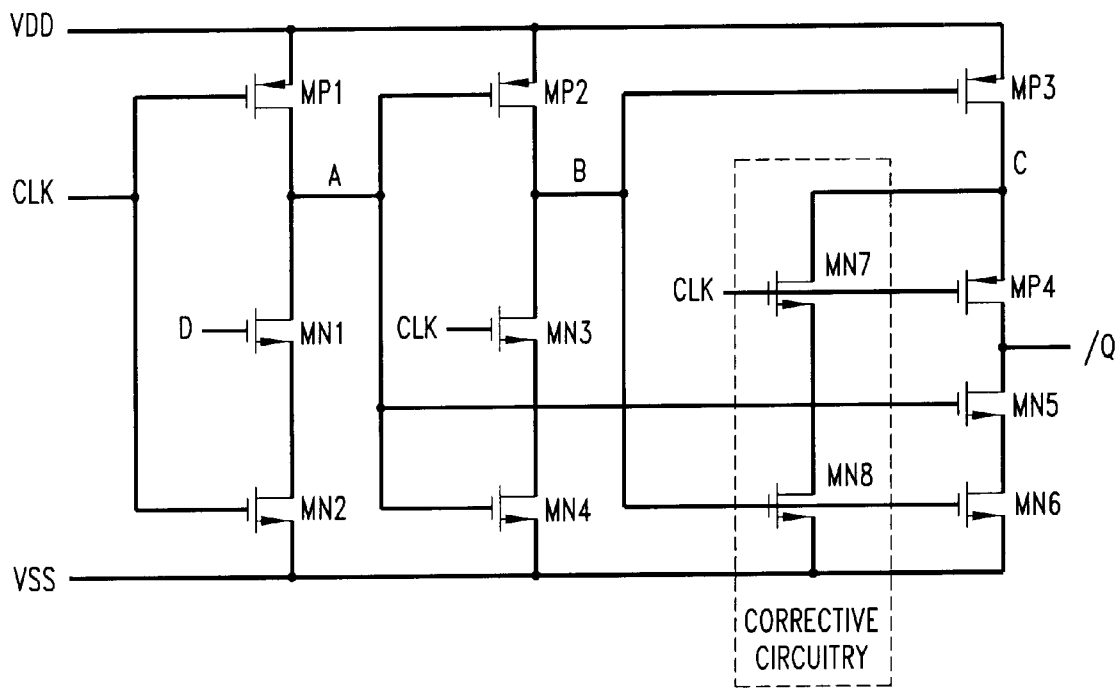
FIG. 3 shows an illustrative embodiment of the present invention incorporating corrective circuitry to avoid shortcomings of the circuit of FIG. 1.

As noted above, judicious sizing of particular transistors in TSPC-1 flip-flops can offer some help in avoiding certain glitch conditions. For example, the size of MN1 and MN2 can be increased to speed the discharge of node A in an attempt to more quickly switch off MN4 and prevent the undesired charging of node C in the example given above. However this approach results in a larger capacitive load for the clock (MN2) and the input D (MN1). Such increase in capacitance, in turn, increases power dissipation in the clock driver and flip-flop outputs (that illustratively drive D inputs in the dual-modulus synchronous divider in incorporated patent application (ii) cited above), or result in a lowered maximum operating frequency. Improved Flip-Flop Circuit A modified version of the TSPC-1 flip-flop of FIG. 1 is shown in FIG. 3. The modified circuit of FIG. 3 includes corrective circuitry applied to node C that avoids transistor size increases in selected transistors as suggested in prior work. The improved circuit of FIG. 3 thus removes the undesired glitch without reducing maximum operating frequency and without substantial increase of power consumption. In typical realizations, the flip-flop of FIG. 3 incurs power dissipation increases on the order of only two percent compared with that of the circuit of FIG. 1. Present inventive solutions avoid limitations in prior approaches, such as those described in U.S. Pat. No. 6,100,730 issued Aug. 8, 2000 to Davis, et al., and in the Huang and Rogenmoser paper cited above.

The improved circuit of FIG. 3 is based, in part, on the observation that the logic level stored on node B during the high phase of the clock is the inverse of the future logic value to be transferred to the /Q output on the subsequent high to low transition of the clock. It therefore proves advantageous to invert this logic level and transfer it directly to node C, preserving the current value of the /Q output. This approach exploits the off state of MP4 during the high clock phase while pre-setting the logic level at node C to the correct future /Q output value. This method also allows any charge that might be previously stored on node C, as described in the example above, to discharge to VSS during the high clock phase. In this manner, the momentary connection of the /Q output to node C does not cause a glitch in the output-since the final value of the output has already been pre-set on node C.

Corrective circuitry in the illustrative embodiment shown in FIG. 3 comprises two NMOS transistors added to the TSPC-1 flip-flop of FIG. 1. In particular, the illustrative embodiment comprises added transistors MN7 and MN8 that are advantageously selected to be minimum size transistors, thereby minimizing any increase in clock load and load at node B. Corrective circuitry reflected as MN7 and MN8 is only active during the high clock phase (while the output stage exhibits tristate operation), thereby avoiding interference with operation of the output stage in its inverter mode.

Illustrative operation of the corrective circuitry of FIG. 3 will now be described. When the clock is high, if node B is logic high (indicating that /Q will be low after the next high to low clock transition), both MN7 and MN8 conduct, thus connecting node C to VSS. This places a logic low on node C in anticipation of the update to /Q. If instead, node B is low, MN8 does not conduct but MP3 does, thus connecting node C to VDD in anticipation of the update for the /Q output. Therefore, if the /Q output is briefly connected to node C before all the transistors in the output branch have settled to their final state of operation for the low clock phase, the output will not glitch, but will hold its then-current value or will begin to transition to an updated state as appropriate.

Effectively, the corrective circuitry of FIG. 3 removes the glitch described previously without adversely affecting outputs for consecutive clock periods, regardless of the pattern of inputs on D. That is, with four possible output possibilities on consecutive falling clock edges (low-to-low, low-to-high, high-to-high, high-to-low), it will be seen that only the low-to-low output case treated in the above example and the high-to-low output transition involve a delay problem between MP4 and MN5 in the circuit of FIG. 1. Since the corrective circuitry of FIG. 3 always presets node C to the appropriate future output value, proper functioning of the flip-flop of FIG. 3 is assured.

Figure 4:
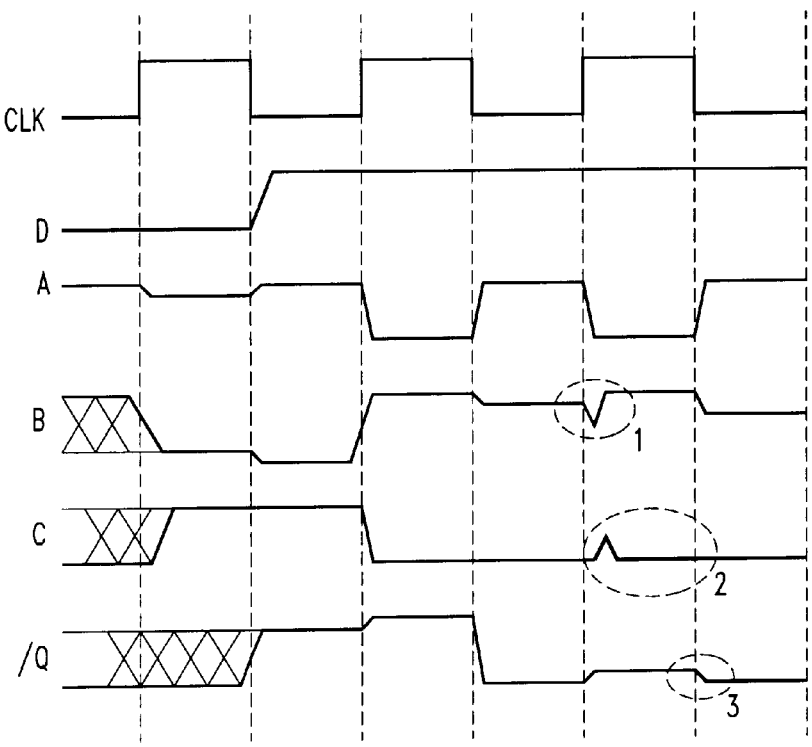
FIG. 4 shows waveforms associated with illustrative operation of the flip-flop of FIG. 3.

FIG. 4 shows waveforms of signals appearing on respective nodes of the circuit of FIG. 3 during several CLK cycles. While the glitch, at reference numeral Ion the node B waveform in FIG. 4 that accompanies a high-to-low transition of CLK persists, it will be seen that an undesired charged condition of node C at such high-to-low transition is avoided (reference numeral 2), thereby avoiding the undesired glitch on the /Q output. That is, only the desired output condition appears at reference numeral 3 on the /Q output shown in FIG. 4.

Figure 5:
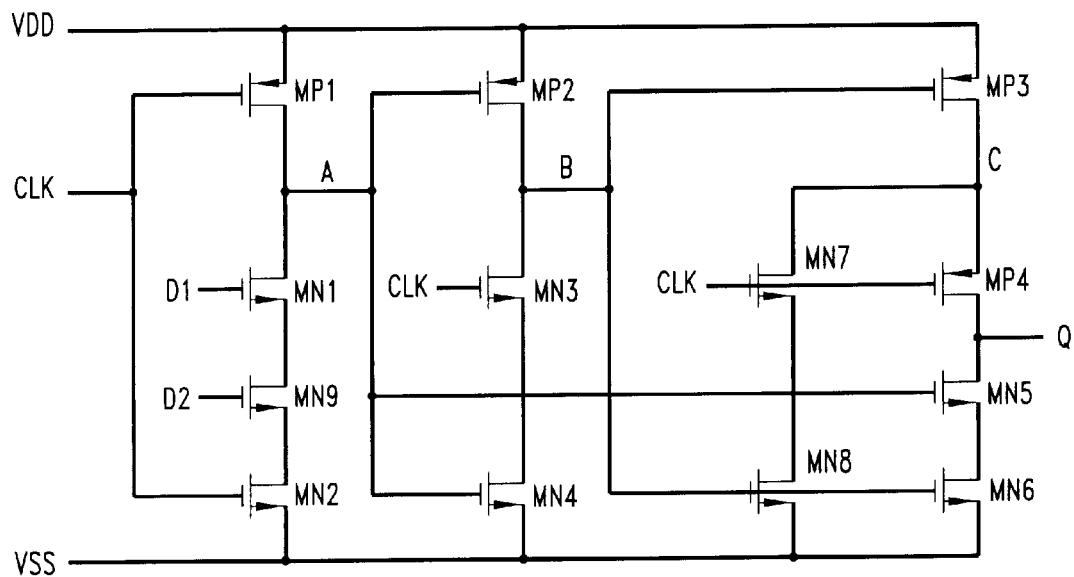
FIG. 5 shows an alternative illustrative embodiment of the present invention incorporating an integrated NAND input as well as corrective circuitry of the type shown in FIG. 3.
Figure 6:
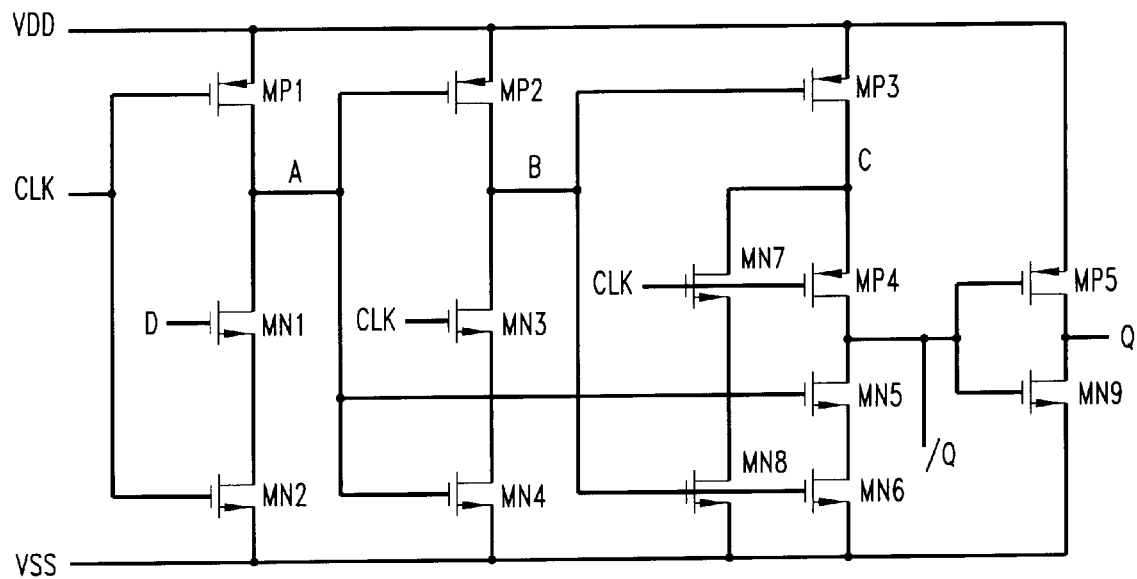
FIG. 6 shows an alternative illustrative embodiment of the present invention incorporating corrective circuitry of the type shown in FIG. 3 and providing complementary outputs.

Alternate illustrative embodiments of the present invention are shown in FIGS. 5 and 6. The circuit of FIG. 5 shows dual inputs (D1 and D2) to respective NMOS devices MN1 and MN2 to provide a NAND logic input. FIG. 6 shows the circuit of FIG. 4 further modified to include PMOS device MP5 and NMOS device MN9 connected across the VDD and VSS supply voltages for purposes of accepting the /Q output and providing a complementary output on the output path Q. Such alternative TSPC-1 flip-flop embodiments will provide flexibility desired in demanding applications such as dual-modulus synchronous dividers described in above-cited incorporated patent application (ii).

Other alternative embodiments based on the above-described illustrative embodiments will employ different particular logic structures and conventions (including voltage conventions) while adhering to present inventive teachings. While particular NMOS and PMOS devices are used by way of illustration in the preceding detailed descriptions, different but equivalent devices and logical combinations of devices known in the art will be used in some applications. The term device as used in the present detailed description will be understood to mean, unless the context requires a different meaning, a MOSFET device, or other transistor or other switching element, including non-CMOS devices-such as gallium arsenide MESFETS.

Further, particular logical input configurations other than the illustrative inverter and NAND logical input configurations will be employed in applying present inventive teachings, as is well known in the art. Moreover, circuit arrangements including NAND and other input logic functions will be implemented in TSPC-1 flip-flop circuits also including circuitry for providing complementary outputs-all within the scope of present inventive teachings.

Still further, it will be recognized by those skilled in the art that the ordering of devices MN7 and MN8 is merely illustrative, and may be reversed in particular applications while continuing to provide desired corrective functionality in substantially eliminating glitches of the types described above in prior TSPC-1 flip-flop circuits. Thus, MN7 in FIGS. 3, 5 and 7 may be adapted to connect node C to the node intermediate MN7 and MN8 in response to signals appearing at node B, and MN8 may be adapted to connect this intermediate node to the supply voltage VSS in response to applied clock signals.

What is claimed is:

1. A TSPC-1 flip-flop circuit comprising
   an input stage having a first input node and a first output node, said input stage precharging said first output node to a first supply voltage during a first part of a clock period and selectively discharging said first output node to a second supply voltage in response to data signals applied in a second part of said clock period,
   a middle stage having a second output node, said middle stage inverting signals at said first output node during said second part of said clock period for application to said second output node, and
   an output stage comprising
      a first device connected between said first supply voltage and a first intermediate node, said first device selectively assuming a conducting state in response to signals at said second output node,
      a second device connected between said first intermediate node and a third output node, said second device selectively assuming a conducting state in response to a transition from said second part of a clock period to said first part of a succeeding clock period,
      a third device connected between said third output node and a second intermediate node, said third device selectively assuming a conducting state in response to signals on said first output node, and
      a fourth device connected between said second intermediate node and said second supply voltage, said fourth device selectively assuming a conducting state in response to signals at said second output node,
   a correction circuit for substantially eliminating glitches at said third output node resulting from charge accumulated at said first intermediate node by connection of said first supply voltage to said first intermediate node prior to said second device assuming said conducting state.

2. The flip-flop of claim 1 wherein said correction circuit comprises a circuit for selectively applying an inverted version of said signal at said second output node to said first intermediate node prior to said second device assuming said conducting state.

3. The flip-flop of claim 1 wherein said correction circuit comprises a circuit for connecting said first intermediate node to said second supply voltage prior to said transition from said second part of a clock period to said first part of a succeeding clock period and the voltage at said second output node is within a predetermined range.

4. The flip-flop of claim 1 wherein said correction circuit comprises a series connection of a fifth device and a sixth device between said first intermediate node and said second supply voltage, said fifth device selectively assuming a conducting state in response to applied clock signals, and said sixth device selectively assuming a conducting state in response to signals at said second output node.

5. The flip-flop of claim 1 wherein said correction circuit comprises
   a fifth device connected between said first intermediate node and a third intermediate node, said fifth device selectively assuming a conducting state in response to applied clock signals, and
   a sixth device connected between said third intermediate node and said second supply voltage, said sixth device selectively assuming a conducting state in response to signals at said second output node.

6. The flip-flop of claim 1 wherein said third output node is in a tristate mode prior to said second device assuming said conducting state.

7. The flip-flop of claim 1 wherein said input stage comprises a circuit for receiving said data signals applied in said second part of said clock period to selectively discharge said first output node in accordance with a logical function of said data signals.

8. The flip-flop of claim 7 wherein said logical function is a NAND function of said data signals.

9. The flip-flop of claim 8 wherein said circuit for selectively discharging said first output node in accordance with said NAND function comprises a plurality of devices connected in series between said first input node and said second supply voltage, said plurality of devices each being responsive to a respective one of said data signals.

10. The flip-flop of claim 1 wherein said output stage further comprises an inverter circuit, said inverter circuit comprising
    a fourth output node, and
    a second input node connected to said third output node, said inverter selectively connecting said fourth output node to
    said first supply voltage when said third output node is at a first voltage, or
    said second supply voltage when said third output node is at a second voltage.

11. The flip-flop circuit of claim 1 wherein said first part of said clock period corresponds to a logical high signal for a true single-phase clock signal, and wherein said first supply voltage is higher than said second supply voltage.

12. In a TSPC-1 flip-flop circuit comprising
    an input stage having a first input node and a first output node, said input stage precharging said first output node to a first supply voltage during a first part of a clock period and selectively discharging said first output node to a second supply voltage in response to data signals applied in a second part of said clock period,
    a middle stage having a second output node, said middle stage inverting signals at said first output node during said second part of said clock period for application to said second output node, and
    an output stage comprising
        a first device connected between said first supply voltage and a first intermediate node, said first device selectively assuming a conducting state in response to signals at said second output node,
        a second device connected between said first intermediate node and a third output node, said second device selectively assuming a conducting state in response to a transition from said second part of a clock period to said first part of a succeeding clock period,
        a third device connected between said third output node and a second intermediate node, said third device selectively assuming a conducting state in response to signals on said first output node, and
        a fourth device connected between said second intermediate node and said second supply voltage, said fourth device selectively assuming a conducting state in response to signals at said second output node,
    means for substantially eliminating glitches at said third output node resulting from charge accumulated at said first intermediate node by connection of said first supply voltage to said first intermediate node prior to said second device assuming said conducting state, and
    means for selectively applying an inverted version of said signal at said second output node to said first intermediate node prior to said second device assuming said conducting state.

13. In a TSPC-1 flip-flop circuit comprising
    an input stage having a first input node and a first output node, said input stage precharging said first output node to a first supply voltage during a first part of a clock period and selectively discharging said first output node to a second supply voltage in response to data signals applied in a second part of said clock period,
    a middle stage having a second output node, said middle stage inverting signals at said first output node during said second part of said clock period for application to said second output node, and
    an output stage comprising
        a first device connected between said first supply voltage and a first intermediate node, said first device selectively assuming a conducting state in response to signals at said second output node,
        a second device connected between said first intermediate node and a third output node, said second device selectively assuming a conducting state in response to a transition from said second part of a clock period to said first part of a succeeding clock period,
        a third device connected between said third output node and a second intermediate node, said third device selectively assuming a conducting state in response to signals on said first output node, and
        a fourth device connected between said second intermediate node and said second supply voltage, said fourth device selectively assuming a conducting state in response to signals at said second output node,
    said output stage thereby exhibiting a tristate condition at said third output node during said second part of said clock period,
    means for substantially eliminating glitches at said third output node resulting from charge accumulated at said first intermediate node by connection of said first supply voltage to said first intermediate node prior to said second device assuming a conducting state, and
    means for applying an inverted version of said signal at said second output node to said first intermediate node when said third output node exhibits said tristate condition.

* * * * *

UNITED STATES PATENT AND TRADEMARK OFFICE
CERTIFICATE OF CORRECTION

PATENT NO.   : 6,448,831 B1
DATED        : September 10, 2002
INVENTOR(S)  : Barry Travis Hunt, Jr. and Scott Robert Humphreys It is certified that error appears in the above-identified patent and that said Letters Patent is hereby corrected as shown below:

<u>Title page,</u>
Item [57], ABSTRACT,
Line 1, please change "Undersired" to -- undesired --
Line 2, please change "an node" to -- an output node --
Line 10, please change "active during" to -- active only during --

<u>Column 7,</u>
Line 26, please change "Ion" to -- 1 on --

Signed and Sealed this

Twenty-fifth Day of February, 2003

JAMES E. ROGAN
*Director of the United States Patent and Trademark Office*